(12) United States Patent
Ji

(10) Patent No.: US 11,790,959 B2
(45) Date of Patent: Oct. 17, 2023

(54) SENSITIVITY AMPLIFIER

(71) Applicant: ChangXin Memory Technologies, Inc., Hefei (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 278 days.

(21) Appl. No.: 17/430,709

(22) PCT Filed: Jun. 19, 2020

(86) PCT No.: PCT/CN2020/097046
§ 371 (c)(1),
(2) Date: Aug. 12, 2021

(87) PCT Pub. No.: WO2021/103501
PCT Pub. Date: Jun. 3, 2021

(65) Prior Publication Data
US 2022/0148628 A1  May 12, 2022

(30) Foreign Application Priority Data
Nov. 28, 2019 (CN) .......................... 201911188084.5

(51) Int. Cl.
*G11C 7/06* (2006.01)
*G11C 7/08* (2006.01)
(Continued)

(52) U.S. Cl.
CPC ................ *G11C 7/062* (2013.01); *G11C 7/08* (2013.01); *G11C 7/12* (2013.01); *G11C 7/1078* (2013.01)

(58) Field of Classification Search
CPC .. G11C 7/062; G11C 7/08; G11C 7/12; G11C 7/1078; G11C 7/02; G11C 2207/002; G11C 11/4091; G11C 7/065
(Continued)

(56) References Cited

U.S. PATENT DOCUMENTS 9,437,282 B1 * 9/2016 Braceras ............... G11C 11/419
2011/0292709 A1 * 12/2011 Takayama ........... G11C 11/4091
365/72

(Continued)

FOREIGN PATENT DOCUMENTS

CN     104036821 A  *  9/2014
CN     104269189 A     1/2015
(Continued)

OTHER PUBLICATIONS

PCT/CN2020/097046 International Search Report dated Sep. 29, 2020, English translation.

*Primary Examiner* — Fernando Hidalgo
(74) *Attorney, Agent, or Firm* — Alston & Bird LLP

(57) ABSTRACT

The disclosure provides a sense amplifier and a control method thereof. The sense amplifier includes: a pre-charge module, a first input and output terminal, a second input and output terminal, a first PMOS transistor, a second PMOS transistor, a first NMOS transistor, and a second NMOS transistor, a first switch unit, a second switch unit, a third switch unit, a fourth switch unit, a fifth switch unit, a sixth switch unit, a seventh switch unit, an eighth switch unit, a first energy storage unit and a second energy storage unit. The sense amplifier can compensate for the offset voltage. The result is a sense amplifier with greatly reduced offset voltage, thereby improving the sensitivity and resolution of the sense amplifier.

11 Claims, 7 Drawing Sheets

(51) Int. Cl.
    *G11C 7/12*    (2006.01)
    *G11C 7/10*    (2006.01)
(58) Field of Classification Search
    USPC .......................................................... 365/207
    See application file for complete search history.

(56) References Cited

U.S. PATENT DOCUMENTS

| | | | | |
|---|---|---|---|---|
| 2014/0204683 A1* | 7/2014 | Sahu | ........................ | G11C 7/08 |
| | | | | 365/189.11 |
| 2015/0380079 A1* | 12/2015 | Agarwal | ............... | G11C 11/419 |
| | | | | 365/156 |
| 2020/0194059 A1* | 6/2020 | Jungmann | ............... | H10B 10/00 |
| 2021/0043266 A1* | 2/2021 | Rosti | ........................ | G06F 9/226 |

FOREIGN PATENT DOCUMENTS

| | | | | |
|---|---|---|---|---|
| CN | 105895139 | A | | 8/2016 |
| CN | 106205664 | A | | 12/2016 |
| CN | 109166598 | A | | 1/2019 |
| CN | 109841240 | A | * | 6/2019 |
| WO | WO 2021/103501 | A1 | | 6/2021 |

* cited by examiner

SENSITIVITY AMPLIFIER

CROSS REFERENCES TO RELATED APPLICATIONS

This application claims the benefit of priority to CN Patent Application 201911188084.5 filed on Nov. 28, 2019, entitled "Sensitivity Amplifier", the contents of which are incorporated herein by reference in its entirety.

TECHNICAL FIELD

The present invention relates to the technical field of integrated circuits, in particular to a sensitivity amplifier and a control method thereof.

BACKGROUND

The random mismatch between devices within a sensitivity amplifier will cause mismatch of threshold voltages between these devices, which will lead to the generation of an offset voltage in the sensitivity amplifier; and the offset voltage will cause the sensitivity amplifier to have a low sense margin when reading data, thus reduces sensitivity and resolution of the sensitivity amplifiers, and increases reading errors.

On the other hand, the small signal differential input voltage of the sensitivity amplifier is generated by charge sharing. As the bit lines have become longer and longer, the parasitic capacitance on the bit lines has become larger and larger. At the same time, the storage capacitance has become smaller and smaller. This will cause the small signal differential input voltage generated by the charge sharing effect to become smaller and smaller, which will increase the impact of the offset voltage more and more significantly.

Thus, it is necessary to provide a sensitivity amplifier and a control method thereof to address the problem of offset voltage which causes low sensitivity, low resolution, and easy reading errors of the sensitivity amplifier in the prior art.

SUMMARY

The present invention provides a sensitivity amplifier, including: a pre-charge module; a first input and output terminal, a second input and output terminal, a first PMOS transistor, a second PMOS transistor, a first NMOS transistor, a second NMOS transistor, a first switch unit, a second switch unit, a third switch unit, a fourth switch unit, a fifth switch unit, a sixth switch unit, a seventh switch unit, an eighth switch unit, a first energy storage unit, and a second energy storage unit;

wherein a first end of the pre-charge module is connected to a first bit line, and a second end of the pre-charge module is connected to a second bit line, and wherein the pre-charge module pre-charges the first bit line and the second bit line to a preset voltage;

wherein the first input and output terminal is connected to the first bit line and the second input and output terminal is connected to the second bit line;

wherein a gate of the first PMOS transistor is connected to the second input and output terminal via the second switch unit, and a drain of the first PMOS transistor is connected to the first input and output terminal via the first switch unit; a gate of the second PMOS transistor is connected to the first input and output terminal through the first switch unit; and a drain of the second PMOS transistor is connected to the second input and output terminal through the second switch unit; wherein a gate of the first NMOS transistor is connected to the second input and output terminal, and is further connected to the first input and output terminal via the third switch unit, a drain of the first NMOS transistor is connected to the first input and output terminal through the third switch unit; wherein a gate of the second NMOS transistor is connected to the first input and output terminal and is further connected is connected to the second input and output terminal through the fourth switch unit, and a drain of the second NMOS transistor is connected to the second input and output terminal via the fourth switch unit;

wherein a first end of the fifth switch unit is connected to a power supply voltage, and a second end of the fifth switch unit is connected to the first input and output terminal;

wherein a first end of the sixth switch unit is connected to the power supply voltage, and the other end of the sixth switch unit is connected to the second input and output terminal;

wherein a first end of the first energy storage unit is connected to the first input and output terminal, and a second end of the first energy storage unit is grounded via the seventh switch unit;

wherein a first end of the second energy storage unit is connected to the second input and output terminal, and a second end of the second energy storage unit is grounded via the eighth switch unit; and wherein the first switch unit, the second switch unit, the third switch unit, and the fourth switch unit configure the first PMOS transistor, the second PMOS transistor, the first NMOS transistor and the second NMOS transistor in an amplification mode or a diode mode.

In some examples, the sensitivity amplifier further comprises: a ninth switch unit and a tenth switch unit, wherein a first end of the ninth switch unit is connected to the first bit line, a second end of the ninth switch unit is connected to the second end of the first energy storage unit; wherein a first end of the tenth switch unit is connected to the second bit line, and a second end of the tenth switch unit is connected to the second end of the second energy storage unit.

In some examples, the sensitivity amplifier further comprises: an eleventh switch unit and a twelfth switch unit, wherein a first end of the eleventh switch unit is connected to the first bit line, a second end of the eleventh switch unit is connected to the first input and output terminal; wherein a first end of the twelfth switch unit is connected to the second bit line, and a second end of the twelfth switch unit is connected to the second input and output terminal.

In some examples, the sensitivity amplifier further comprises: a first driving transistor and a second driving transistor, wherein a first end of the first driving transistor is connected to the power supply voltage, and a second end of the first driving transistor is connected to a source of the first PMOS transistor and a source of the second PMOS transistor; wherein a first end of the second drive transistor is grounded, and a second end of the second drive transistor is connected to a source of the first NMOS transistor and a source of the second NMOS transistor.

In some examples, the first driving transistor comprises a PMOS transistor, a source of the first driving transistor is connected to the power supply voltage, and a drain of the first driving transistor is connected to the source of the first PMOS transistor and the source of the second PMOS transistor; wherein the second driving transistor comprises an NMOS transistor, a source of the second driving transistor is grounded, and a drain of the second driving transistor is connected with the source of the first NMOS transistor and the source of the second NMOS transistor.

In some examples, the sensitivity amplifier further comprises: a first switch transistor, a second switch transistor, a third energy storage unit, and a fourth energy storage unit; wherein a first end of the first switch transistor is connected to the first bit line, a second end of the first switch transistor is connected to a first end of the third energy storage unit and a second end of the third energy storage unit is grounded; wherein a first end of the second switch transistor is connected to the second bit line, and a second end of the second switch transistor is connected to a first end of the fourth energy storage unit, and a second end of the fourth energy storage unit is grounded.

In some examples, the third switch unit comprises a third switch transistor and a fifth switch transistor, and the fourth switch unit comprises a fourth switch transistor and a sixth switch transistor;

wherein one end of the third switch transistor is connected to the first input and output terminal, the other end of the third switch transistor is connected to the drain of the first NMOS transistor; and wherein a first end of the fifth switch transistor is connected to the drain of the first NMOS transistor, and a second end of the fifth switch transistor is connected to a gate of the first NMOS transistor;

wherein a first end of the fourth switch transistor is connected to the second input and output terminal, a second end of the fourth switch transistor is connected to the drain of the second NMOS transistor; and wherein a first end of the sixth switch transistor is connected to the drain of the second NMOS transistor, and a second end of the sixth switch transistor is connected to the gate of the second NMOS transistor.

In some examples, the third switch transistor, the fourth switch transistor, the fifth switch transistor, and the sixth switch transistor are either NMOS transistors or transmission gates composed of NMOS transistors and PMOS transistors.

The disclosure provides a control method of the sensitivity amplifier, the control method includes a plurality of stages:

a pre-charging stage:
pre-charging the first bit line and the second bit line to the preset voltage; and
an offset-voltage compensation stage:
adjusting a connection mode of the first PMOS transistor, the second PMOS transistor, the second NMOS transistor, and the second NMOS transistor to compensate an offset voltage difference between the first input and output terminal and the second input and output terminal.

In some examples, the offset-voltage compensation stage comprises the following steps:

placing at least the first switch unit, the second switch unit, the third switch unit, and the fourth switch unit in an off state, and placing the fifth switch unit and the sixth switch unit, the seventh switch unit and the eighth switch unit in a connected state, wherein the first input output terminal and the second input output terminal are charged to the power supply voltage;

placing the fifth switch unit and the sixth switch unit in the off state, short-circuiting a gate of the first NMOS transistor and the drain of the first NMOS transistor, and connecting a gate the second NMOS transistor and a drain of the second NMOS transistor to discharge a voltage of the first input and output terminal to a threshold voltage of the second NMOS transistor, and discharging a voltage of the second input and output terminal to a threshold voltage of the first NMOS transistor.

In some examples, after the offset-voltage compensation stage, the method further comprises:

a small signal amplification stage:
connecting the first NMOS transistor and the second NMOS transistor into an amplification mode, and amplifying the offset voltage difference between the first input and output terminal and the second input and output terminal;

connecting the first PMOS transistor and the second PMOS transistor in an amplification mode, and is pulling up a voltage of the first input and output terminal or a voltage of the second input and output terminal to the power supply voltage; and a write back stage: writing back to the first bit line.

Figure 1:
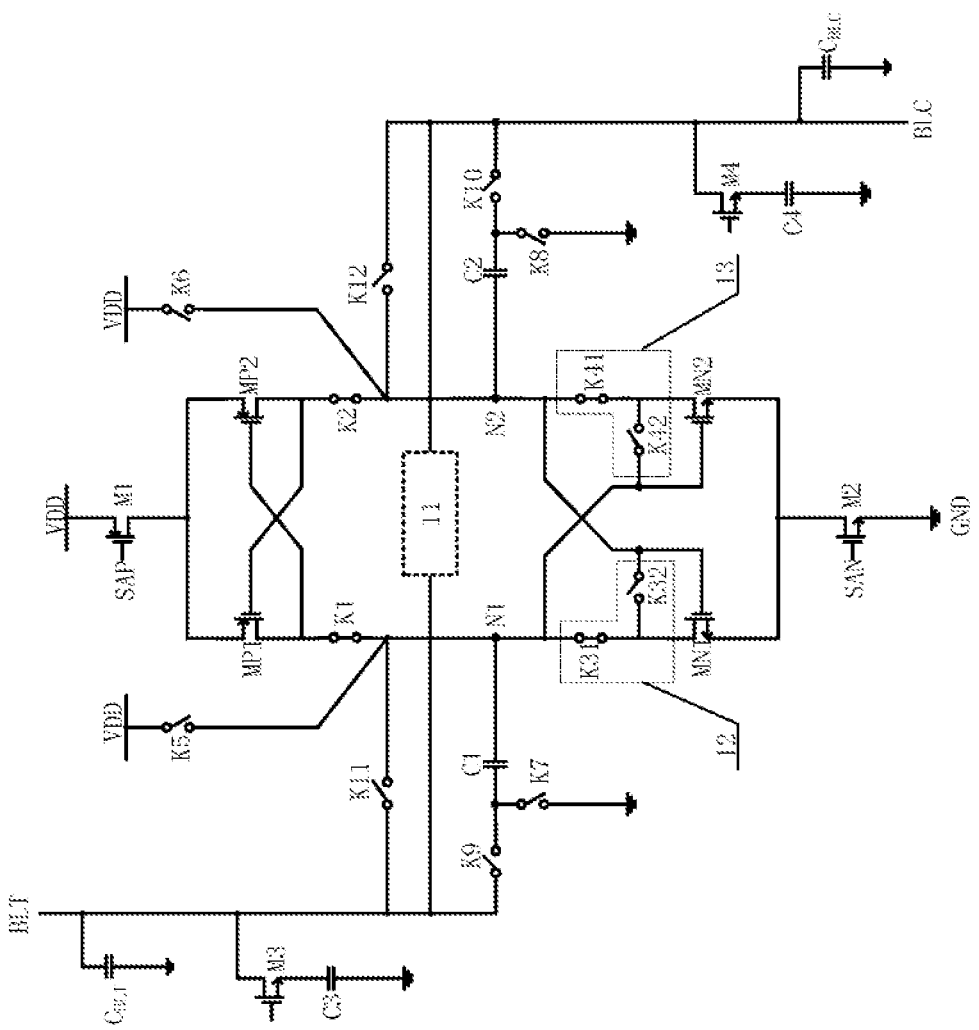
FIG. 1 is a circuit diagram of a sensitivity amplifier in a pre-charge state according to an embodiment of the present disclosure.

DESCRIPTIONS OF THE REFERENCE NUMERALS 11 pre-charging module
12 the third switch unit
13 the fourth switch unit.

DETAILED DESCRIPTION OF THE PREFERRED EMBODIMENTS

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

In order to facilitate the understanding of the present invention, the present invention will be described more fully below with reference to the relevant drawings. The preferred embodiment of the invention is shown in the drawings. However, the present invention can be implemented in many different forms and is not limited to the embodiments described herein. On the contrary, the purpose of providing these embodiments is to make the disclosure of the present invention more thorough and comprehensive.

Unless otherwise defined, all technical and scientific terms used herein have the same meaning as commonly understood by those skilled in the technical field of the present invention. The terms used in the specification of the present invention herein are only for the purpose of describing specific embodiments, and are not intended to limit the present invention. The term "and/or" as used herein includes any and all combinations of one or more related listed items.

In the description of the present invention, it should be understood that the terms "upper", "lower", "vertical", "horizontal", "inner", "outer", etc. indicate the orientation or positional relationship based on the drawings shown. The method or position relationship is only for the convenience of describing the present invention and simplifying the description, rather than indicating or implying that the device or element referred to must have a specific orientation, be constructed and operated in a specific orientation, and therefore cannot be understood as a limitation of the present invention.

In one embodiment, as shown in FIGS. 1 to 7, the present invention provides a sensitivity amplifier, including: a pre-charge module 11, a first input and output terminal N1, a second input and output terminal N2, a first PMOS transistor MP1, the second PMOS transistor MP2, the first NMOS transistor MN1, the second NMOS transistor MN2, the first switching unit K1, the second switching unit K2, the third switching unit 12, the fourth switching unit 13, the fifth switching unit K5, and the sixth switch unit K6, the seventh switch unit K7, the eighth switch unit K8, the first energy storage unit C1 and the second energy storage unit C2; wherein, one end of the pre-charge module 11 is connected to the first bit line BLT, and the other end of the pre-charge module 11 is connected to the second bit line BLC. The pre-charge module 11 pre-charges the first bit line BLT and the second bit line BLC to a preset voltage; the first input and output terminal N1 is connected to the first bit line BLT; the second input and output terminal N2 is connected to the second bit line BLC; the gate of the first PMOS transistor MP1 is connected to the second input and output terminal N2 via the second switch unit K2, and the drain of the first PMOS transistor MP1 is connected via the first switch unit K1 to the first input and output terminal N1; the gate of the second PMOS transistor MP2 is connected to the first input and output terminal N1 through the first switch unit K1, and the drain of the second PMOS transistor MP2 is connected to the first input and output terminal N2 through the second switch unit K2. The gate of the first NMOS transistor MN1 is connected to the second input and output terminal N2, and is connected to the first input and output terminal N1 through the third switch unit 12, and the drain of the first NMOS transistor MN1 is connected to the first input and output terminal N1 through the third switch unit 12; the gate of the second NMOS transistor MN2 is connected to the first input and output terminal N1, and is connected to the second input and output terminal N2 through the fourth switch unit 13. The drain of the second NMOS transistor MN2 is connected to the second input/output terminal N2 via the fourth switch unit 13; one end of the fifth switch unit K5 is connected to the power supply voltage VDD, and the other end is connected to the first input/output terminal N1. One end of the sixth switch unit K6 is connected to the power supply voltage VDD, and the other end is connected to the second input and output terminal N2. One end of the first energy storage unit C1 is connected to the first input and output terminal N1, and the other end is grounded through the seventh switch unit K7. One end of the second energy storage unit C2 is connected to the second input and output terminal N2, and the other end is grounded through the eighth switch unit K8. The first switch unit K1, the second switch unit K2, the third switch unit 12, and the fourth switch unit 13 are configured to set the first PMOS transistor MP1, the second PMOS transistor MP2, the first NMOS transistor MN1, and the second NMOS transistor MN2 into the amplification mode or the diode mode.

The above-mentioned sensitivity amplifier can compensate for the offset voltage, so that the offset voltage of the sensitivity amplifier is significantly reduced, thereby improving the sensitivity and resolution of the sensitivity amplifier.

In an example, the sensitivity amplifier further includes: a ninth switch unit K9 and a tenth switch unit K10; one end of the ninth switch unit K9 is connected to the first bit line BLT, and the other end of the ninth switch unit K9 is connected to one end of the first energy storage capacitor C1; one end of the tenth switch unit K10 is connected to the second bit line BLC, and the other end of the tenth switch unit K10 is connected to one end of the second energy storage capacitor C2.

In an example, the sensitivity amplifier further includes: an eleventh switch unit K11 and a twelfth switch unit K12; one end of the eleventh switch unit K11 is connected to the first bit line BLT, and the other end of the eleventh switch unit K11 is connected to the first input/output terminal N1; one end of the twelfth switch unit K12 is connected to the second bit line BLC, and the other end of the twelfth switch unit K12 is connected to the second input and output terminal N2.

In the above example, the first switch unit K1, the second switch unit K2, the fifth switch unit K5, the sixth switch unit K6, the seventh switch unit K7, the eighth switch unit K8, the ninth switch unit K9, and the tenth switch unit K10, the eleventh switch unit K11, and the twelfth switch unit K12 may all be NMOS transistors or transmission gates composed of NMOS and PMOS transistors. Here the transmission gate refers a bilateral switch consisting of NMOS and PMOS transistors controlled by externally applied logic levels.

In an example, the sensitivity amplifier further includes: a first driving transistor M1 and a second driving transistor M2; one end of the first driving transistor M1 is connected to the power supply voltage VDD, and the other end is connected to the source of the first PMOS transistor MP1 and the source of the second PMOS transistor MP2; one end of the second driving transistor M2 is grounded, and the other end is connected to the source of the first NMOS transistor MN1 and the source of the second NMOS transistor MN2.

Specifically, the first driving transistor M1 includes a PMOS transistor, the source of the first driving transistor M1 is connected to the power supply voltage VDD, the drain of the first driving transistor M1 is connected to the source of the first PMOS transistor MP1 and the second PMOS transistor MP2. The source of the second driving transistor M2 comprises an NMOS transistor, the source of the second driving transistor M2 is grounded, the drain of the second driving transistor M2 is connected to the source of the first NMOS transistor MN1 and the source of the second NMOS transistor MN2.

In an example, the sensitivity amplifier further includes a first switch transistor M3, a second switch transistor M4, a third energy storage unit capacitor C3, and a fourth energy storage unit capacitor C4; one end of the first switch transistor M3 is connected to the first bit line BLT, the other end of the first switch transistor M3 is connected to one end of the third energy storage unit C3, and the other end of the third energy storage unit C3 is grounded; one end of the second switch transistor M4 is connected to the second bit line BLC, and the other end of the second switch transistor M4 is connected to one end of the fourth energy storage unit C4, and the other end of the fourth energy storage unit C4 is grounded.

In an example, the first switching transistor M3 may be an NMOS transistor, the drain of the first switching transistor M3 is connected to the first bit line BLT, and the source of the first switching transistor M3 is connected to the third energy storage unit C3; The second switching transistor M4 may be an NMOS transistor, the drain of the second switching transistor M4 is connected to the second bit line BLC, and the source of the second switching transistor M4 is connected to the fourth energy storage unit C4.

In an example, the third switch unit 12 includes a third switch transistor K31 and a fifth switch transistor K32, and the fourth switch unit 13 includes a fourth switch transistor K41 and a sixth switch transistor K42; one end of the third switch transistor K31 is connected to the input and output terminal N1, the other end of the third switch transistor K31 is connected to the drain of the first NMOS transistor MN1, one end of the fifth switch transistor K32 is connected to the drain of the first NMOS transistor MN1, and the other end of the fifth switch transistor K32 is connected to the gate of the first NMOS transistor MN1; one end of the fourth switch transistor K41 is connected to the second input and output terminal N2, the other end of the fourth switch transistor K41 is connected to the drain of the second NMOS transistor MN2, and one end of the sixth switch transistor K42 is connected to the drain of the second NMOS transistor MN2, and the other end of the sixth switch transistor K42 is connected to the gate of the second NMOS transistor MN2.

In an example, the third switch transistor K31, the fourth switch transistor K41, the fifth switch transistor K32, and the sixth switch transistor K42 are all NMOS transistors or transmission gates composed NMOS and PMOS transistors.

The present invention also provides a control method of the above-mentioned sensitivity amplifier, including:

Pre-charge stage: pre-charge the first bit line BLT and the second bit line BLC to preset voltage;

Offset-voltage compensation stage: adjust the connection modes of the first PMOS transistor MP1, the second PMOS transistor MP2, the first NMOS transistor MN1 and the second NMOS transistor MN2, so as to compensate the offset voltage difference of the first input and output terminal N1 and the second input and output terminal N2.

In an example, as shown in FIG. 1, a pre-charge (EQ) module 11 is used to pre-charge the first bit line BLT and the second bit line BLC to a preset voltage. When the pre-charging is completed, the pre-charge module 11 is disconnected. Specifically, the preset voltage may be half of the power supply voltage or other values.

Figure 2:
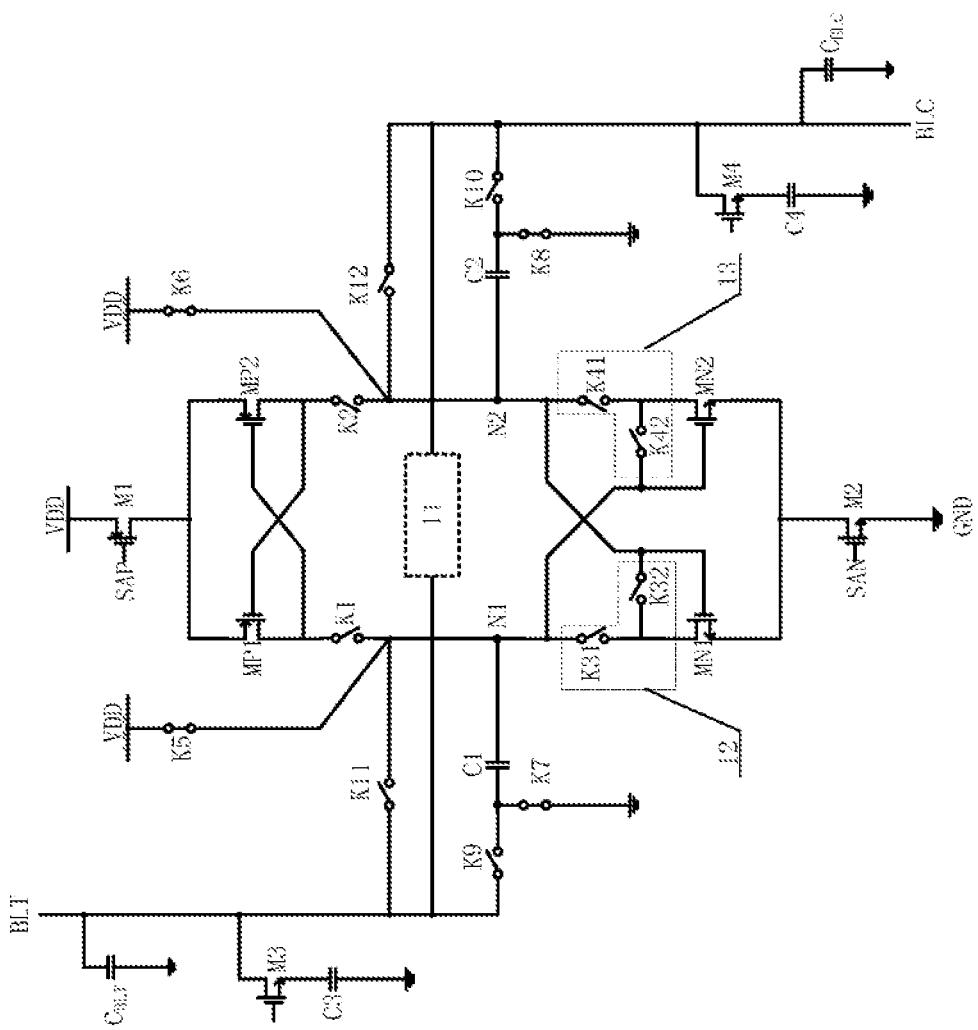
FIG. 2 and FIG. 3 are circuit diagrams of a sensitivity amplifier in an offset-voltage compensation state according to some embodiments of the present disclosure.
Figure 3:
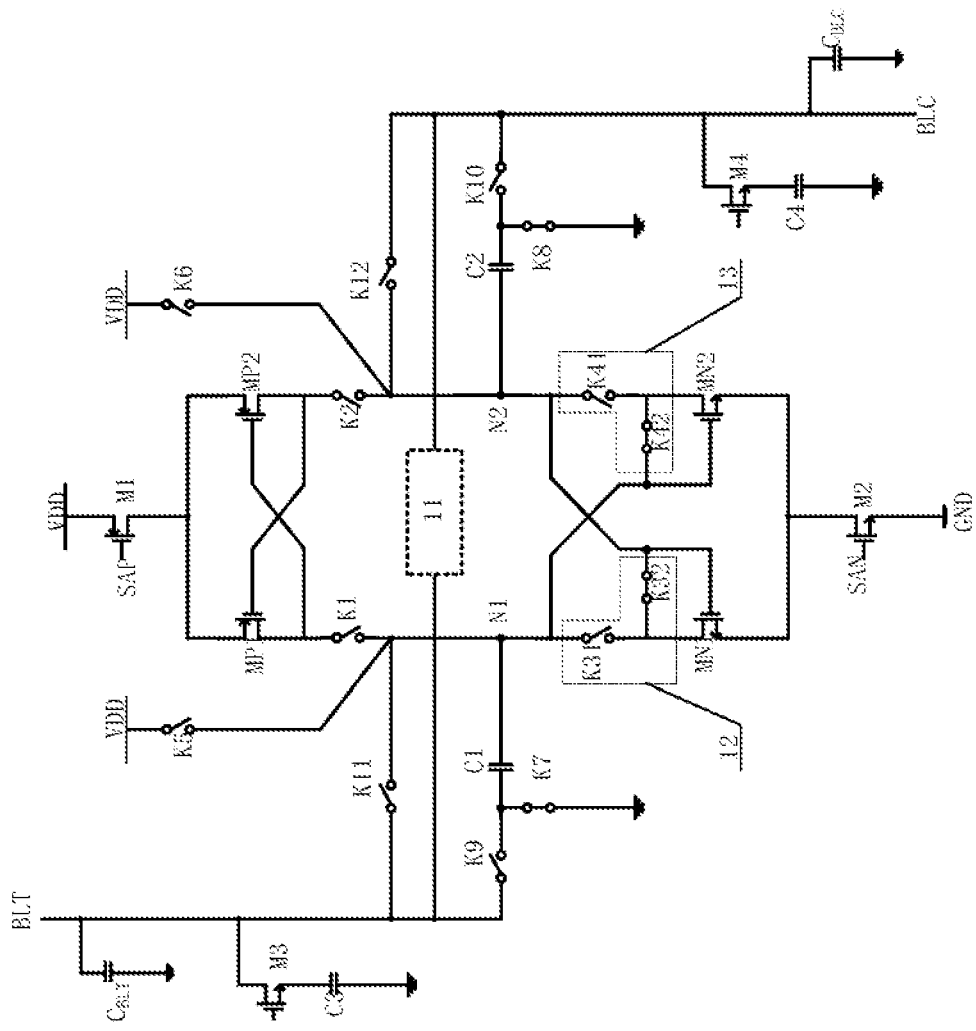

In an example, the offset-voltage compensation stage includes the following steps: first, the first switch unit K1, the second switch unit K2, the eleventh switch unit K11, the twelfth switch unit K12, the third switch unit 12, and the fourth switch unit 13 are all placed in the open (off) state, and the fifth switch unit K5, the sixth switch unit K6, the seventh switch unit K7, and the eighth switch unit K8 are placed in the closed (on) state, as shown in FIG. 2. The input and output terminals N1 and the second input and output terminals N2 are charged to the power supply voltage VDD; then, the fifth switch unit K5 and the sixth switch unit K6 are placed in the of state, and the fifth switch transistor K32 is closed to turn on the first NMOS transistor MN1, where the gate of MN1 is directly connected with the drain of the first NMOS transistor MN1, and the sixth switch transistor K42 is closed to short connect the gate and the drain of the second NMOS transistor MN2, as shown in FIG. 3. As shown, the voltage of the first input and output terminal N1 is discharged to the threshold voltage of the second NMOS transistor MN2, and the voltage of the second input and output terminal N2 is discharged to the threshold voltage of the first NMOS transistor MN1. Thus the charge on the threshold voltage of the first NMOS transistor MN1 is stored on the second energy storage unit C2, and the charge on the threshold voltage of the second NMOS transistor MN2 is stored on the first energy storage unit C1.

In one of the examples, the offset-voltage compensation stage is followed with:

Small signal amplification stage: connect the first NMOS transistor MN1 and the second NMOS transistor MN2 into an amplification mode, and amplify the voltage difference between the first input and output terminal N1 and the second input and output terminal N2; connect the first PMOS transistor MP1 and the second PMOS transistor MP2 to an amplification mode, and pulled up the voltage of the first input/output terminal N1 or the voltage of the second input/output terminal N2 to the power supply voltage VDD.

Write back stage: write back to the first bit line BLT.

Figure 4:
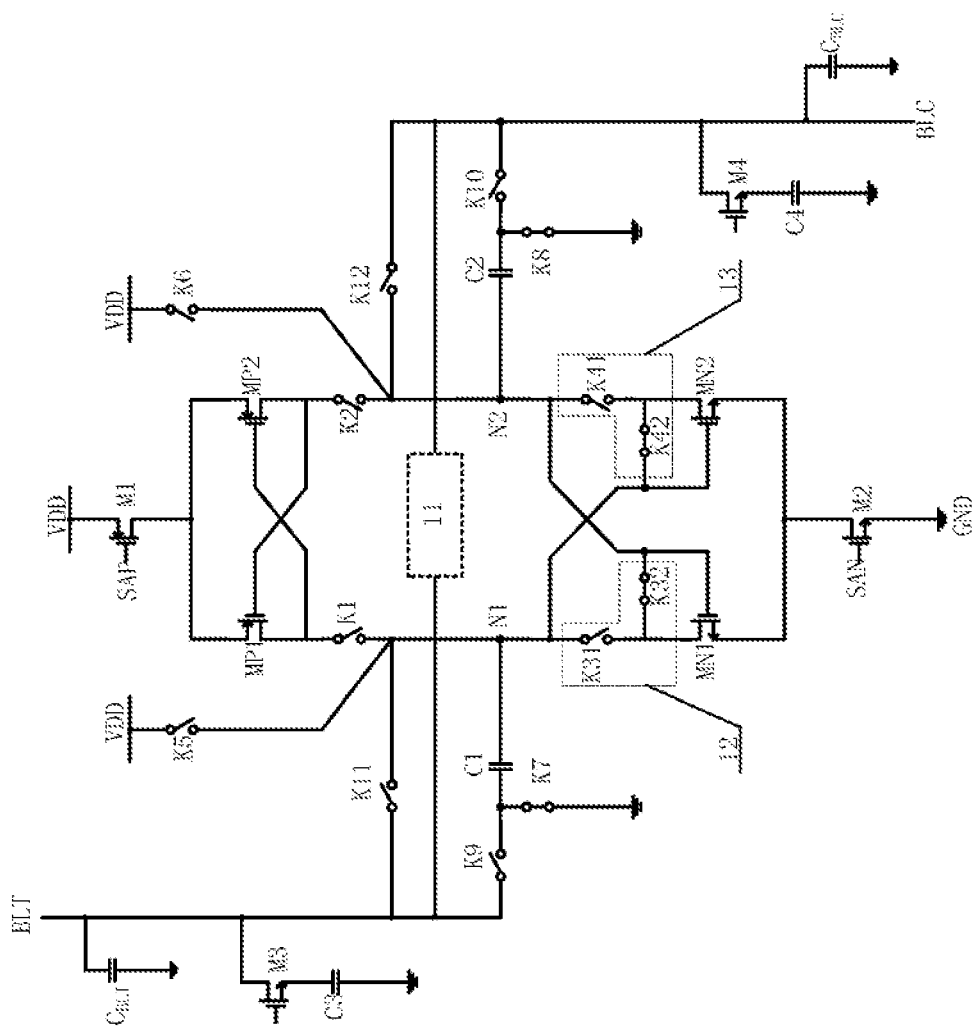
FIG. 4 to FIG. 6 are circuit diagrams of a sensitivity amplifier in a small signal amplification state according to an embodiment of the present disclosure.
Figure 5:
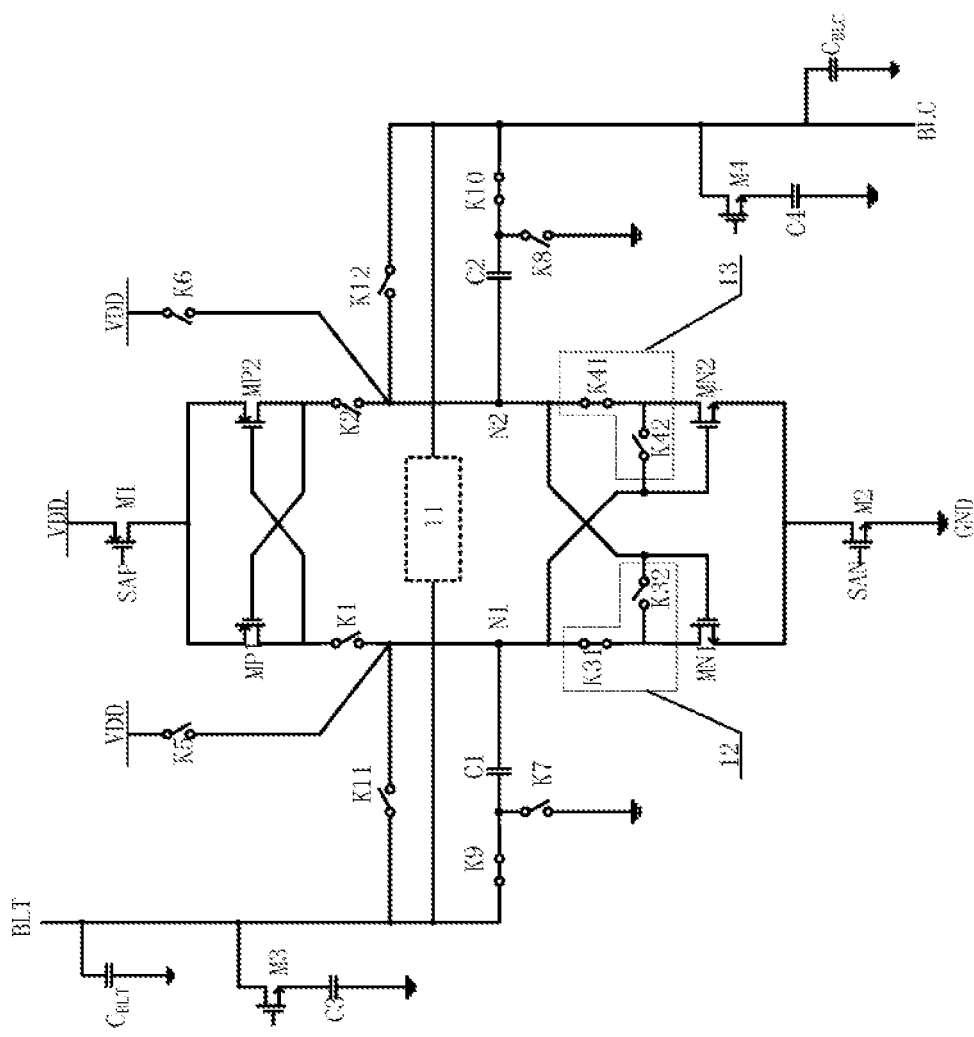
Figure 6:
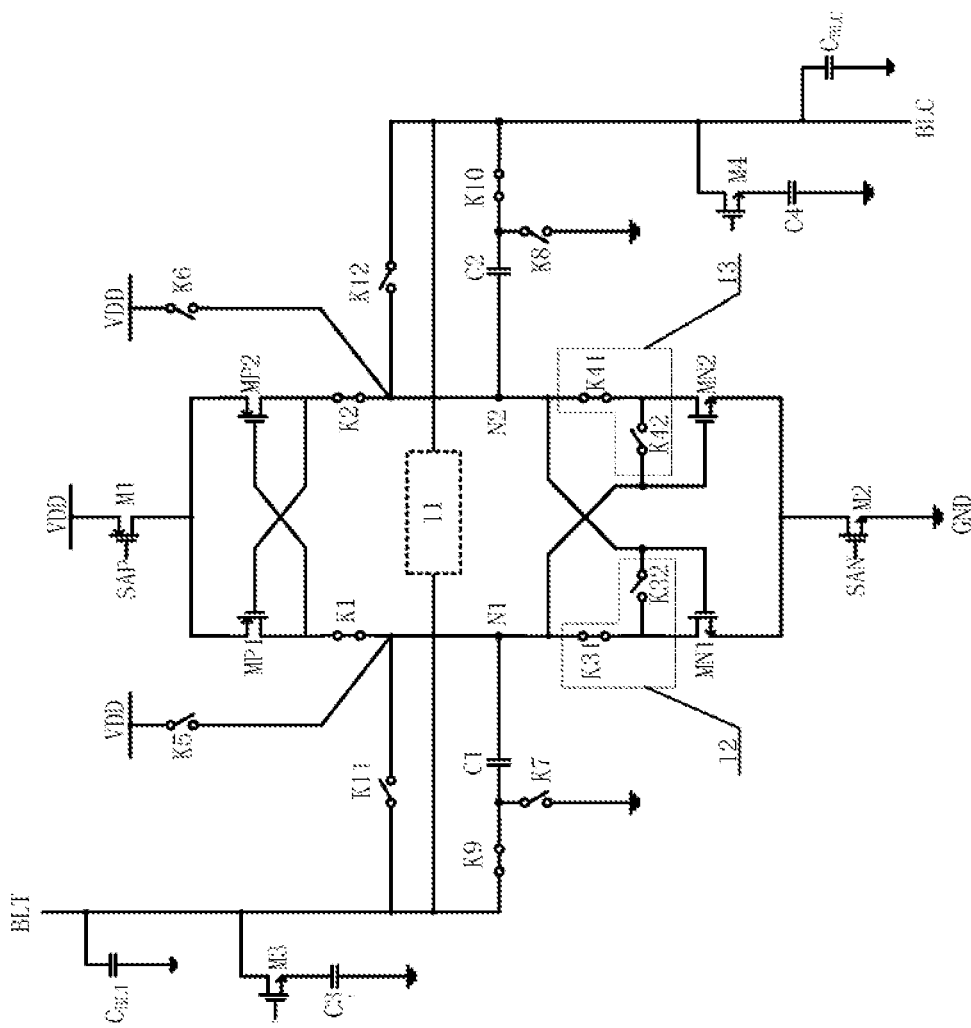

Specifically, the small signal amplification stage includes: first, jump up the voltage of the control terminal of the first switch transistor M3 from a low to a high level, so that the first switch transistor M3 is turned on, and the third energy storage unit C3 is connected to the first bit line BLT. As shown in FIG. 4, when the voltage of the third energy storage unit C3 is lower than the voltage of the first bit line BLT, the first bit line BLT charges the third energy storage unit C3. When the voltage of the energy unit C3 is higher than the voltage of the first bit line BLT, the third energy storage unit C3 charges the first bit line BLT; secondly, close the ninth switch unit K9 and the tenth switch unit K10, and disconnect the seventh switch unit K7 and the eighth switch unit K8, the fifth switch transistor K32 and the sixth switch transistor K42, and close the third switch transistor K31 and the fourth switch transistor K41, as shown in FIG. 5. Because the voltage across the first energy storage unit C1 and voltage across the second energy storage unit C2 cannot change instantly, at this time, the voltage at the first input and output terminal N1 is the sum of the threshold voltage of the second NMOS transistor MN2 and the voltage of the first bit line BLT, and the voltage at the second input and output terminal N2 is the sum of the threshold voltage of the first NMOS transistor NM1 and the voltage of the second bit line BLC. The first NMOS transistor MN1 and the second NMOS transistor MN2 are connected in amplification mode to facilitate the amplification of the differential input signal. At this time, the first PMOS transistor MP1 and the second PMOS transistor MP2 are not involved in the amplification process. If the third energy storage unit C3 charges the first bit line BLT in the process of FIG. 4, the voltage of the first input and output terminal N1 in the process in FIG. 5 is greater than the voltage of the second input and output terminal N2. If the first bit line BLT charges the third energy storage unit C3 in the process of FIG. 4, the voltage of the first input and output terminal N1 in the process of FIG. 5 is less than the voltage of the second input and output terminal N2. Finally, the first switch unit K1 and the second switch unit K2 are closed to connect the first PMOS transistor MP1 and the second PMOS transistor MP2, as shown in FIG. 6. The voltage SAP of the control terminal of the first drive transistor M1 is pulled down to turn on the first driving transistor M1, the first PMOS transistor MP1 and the second PMOS transistor MP2 are connected into the amplification mode. The first PMOS transistor MP1 and the second PMOS transistor MP2 are used to pull up the first input and output terminal N1 or the second input and output terminal N2 to the power supply voltage VDD. Specifically, before the process shown in FIG. 6, if the voltage of the first input and output terminal N1 is greater than the voltage of the second input and output terminal N2, the first PMOS transistor MP1 enhances its pull-up, the first NMOS transistor MN1 reduces its pull-down, so the voltage of the first input and output terminal N1 is pulled up to the power supply voltage VDD; and at the same time, the second PMOS transistor MP2 reduces its pull-up, and the second NMOS transistor MN2 enhances its pull-down, so the voltage of the second input and output terminal N2 is pulled down to the ground voltage (GND). Before the process shown in FIG. 6, if the voltage of the first input and output terminal N1 is less than the voltage of the second input and output terminal N2, the second PMOS transistor MP2 enhances its pull-up, the second NMOS transistor MN2 reduces its pull-down, so the voltage of the second input and output terminal N2 is pulled up to the power supply voltage VDD. At the same time, the first PMOS transistor MP1 reduces its pull-up, the first NMOS transistor MN1 enhances its pull-down, so the voltage of the first input and output terminal N1 is pulled down to the ground voltage. It should be noted that in the small signal amplification stage, the voltage of the first input and output terminal N1 and the voltage of the second input and output terminal N2 have been differentiated by a larger value, that is, the voltage of the first input and output terminal N1 and the voltage of the second input and output terminal N2 are quite different now, thus the mismatch between the first PMOS transistor MP1 and the second PMOS transistor MP2 is not enough to induce a reading error.

Figure 7:
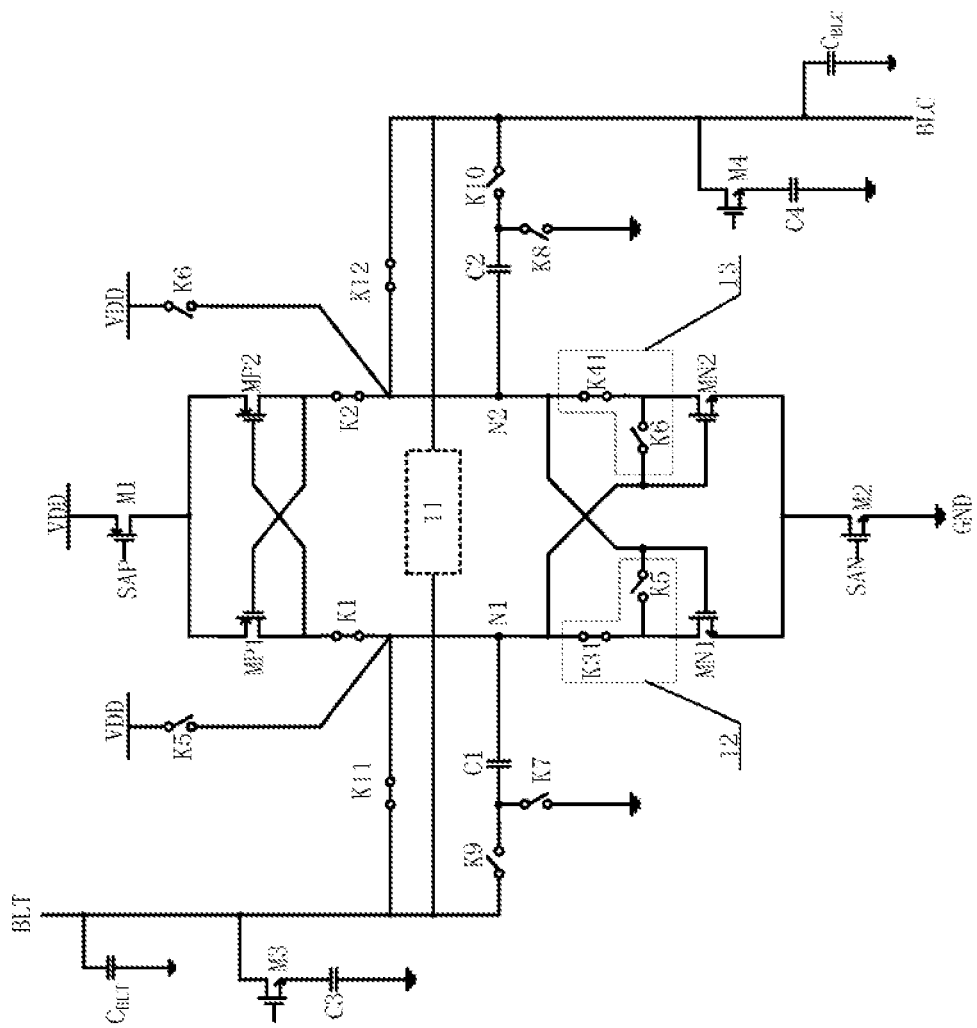
FIG. 7 is a circuit diagram of a sensitivity amplifier in a write-back state according to an embodiment of the present disclosure.

In an example, as shown in FIG. 7, the write-back stage includes specifically: place the eleventh switch unit K11 in a closed state to write back to the first bit line BLT; more specifically: disconnect the ninth switch unit K9, and close the eleventh switch unit K11, thus the first input and output terminal N1 charges the third energy storage unit C3 to facilitate writing back to the first bit line BLT.

It should be noted that it is also possible to open the tenth switch unit K10 and close the twelfth switch unit K12, so that the second input and output terminal N2 charges the fourth energy storage unit C4, thus to facilitate writing back to the charging of the second bit line BLC.

The technical features of the above embodiments can be combined in many ways. In order to make the description concise, not all possible combinations of the technical features in the above embodiments are described. However, as long as there is no contradiction in the combination of these technical features, they should be considered as in the range described in this specification.

The above examples only express a few implementation modes of the present invention, and the description is relatively specific and detailed, but it should not be understood as a limitation on the scope of the invention patent. It should be pointed out that for those of ordinary skill in the art, without departing from the concept of the present invention, several modifications and improvements can be made, and these all fall within the protection scope of the present invention. Therefore, the protection scope of the patent of the present invention should be subject to the appended claims.

What is claimed is:

1. A sensitivity amplifier, comprising:
a pre-charge module;
a first input and output terminal, a second input and output terminal, a first PMOS transistor, a second PMOS transistor, a first NMOS transistor, a second NMOS transistor, a first switch unit, a second switch unit, a third switch unit, a fourth switch unit, a fifth switch unit, a sixth switch unit, a seventh switch unit, an eighth switch unit, a first energy storage unit, and a second energy storage unit;
wherein a first end of the pre-charge module is connected to a first bit line, and a second end of the pre-charge module is connected to a second bit line, and wherein the pre-charge module pre-charges the first bit line and the second bit line to a preset voltage;
wherein the first input and output terminal is connected to the first bit line and the second input and output terminal is connected to the second bit line;
wherein a gate of the first PMOS transistor is connected to the second input and output terminal via the second switch unit, and a drain of the first PMOS transistor is connected to the first input and output terminal via the first switch unit; a gate of the second PMOS transistor is connected to the first input and output terminal through the first switch unit; and a drain of the second PMOS transistor is connected to the second input and output terminal through the second switch unit; wherein a gate of the first NMOS transistor is connected to the second input and output terminal, and is further connected to the first input and output terminal via the third switch unit, a drain of the first NMOS transistor is connected to the first input and output terminal through the third switch unit; wherein a gate of the second NMOS transistor is connected to the first input and output terminal and is further connected is connected to the second input and output terminal through the fourth switch unit, and a drain of the second NMOS transistor is connected to the second input and output terminal via the fourth switch unit;
wherein a first end of the fifth switch unit is connected to a power supply voltage, and a second end of the fifth switch unit is connected to the first input and output terminal;
wherein a first end of the sixth switch unit is connected to the power supply voltage, and the other end of the sixth switch unit is connected to the second input and output terminal;
wherein a first end of the first energy storage unit is connected to the first input and output terminal, and a second end of the first energy storage unit is grounded via the seventh switch unit;
wherein a first end of the second energy storage unit is connected to the second input and output terminal, and a second end of the second energy storage unit is grounded via the eighth switch unit; and
wherein the first switch unit, the second switch unit, the third switch unit, and the fourth switch unit configure the first PMOS transistor, the second PMOS transistor, the first NMOS transistor and the second NMOS transistor in an amplification mode or a diode mode.

2. The sensitivity amplifier according to claim 1, further comprising: a ninth switch unit and a tenth switch unit, wherein a first end of the ninth switch unit is connected to the first bit line, a second end of the ninth switch unit is connected to the second end of the first energy storage unit; wherein a first end of the tenth switch unit is connected to the second bit line, and a second end of the tenth switch unit is connected to the second end of the second energy storage unit.

3. The sensitivity amplifier according to claim 1, wherein the sensitivity amplifier further comprises: an eleventh switch unit and a twelfth switch unit, wherein a first end of the eleventh switch unit is connected to the first bit line, a second end of the eleventh switch unit is connected to the first input and output terminal; wherein a first end of the twelfth switch unit is connected to the second bit line, and a second end of the twelfth switch unit is connected to the second input and output terminal.

4. The sensitivity amplifier according to claim 1, further comprising: a first driving transistor and a second driving transistor, wherein a first end of the first driving transistor is connected to the power supply voltage, and a second end of the first driving transistor is connected to a source of the first PMOS transistor and a source of the second PMOS transistor; wherein a first end of the second drive transistor is grounded, and a second end of the second drive transistor is connected to a source of the first NMOS transistor and a source of the second NMOS transistor.

5. The sensitivity amplifier of claim 4, wherein the first driving transistor comprises a PMOS transistor, a source of the first driving transistor is connected to the power supply voltage, and a drain of the first driving transistor is connected to the source of the first PMOS transistor and the source of the second PMOS transistor; wherein the second driving transistor comprises an NMOS transistor, a source of the second driving transistor is grounded, and a drain of the second driving transistor is connected with the source of the first NMOS transistor and the source of the second NMOS transistor.

6. The sensitivity amplifier of claim 1, further comprising:
a first switch transistor, a second switch transistor, a third energy storage unit, and a fourth energy storage unit;
wherein a first end of the first switch transistor is connected to the first bit line, a second end of the first switch transistor is connected to a first end of the third energy storage unit and a second end of the third energy storage unit is grounded; wherein a first end of the second switch transistor is connected to the second bit line, and a second end of the second switch transistor is connected to a first end of the fourth energy storage unit, and a second end of the fourth energy storage unit is grounded.

7. The sensitivity amplifier of claim 6, wherein:
the third switch unit comprises a third switch transistor and a fifth switch transistor, and the fourth switch unit comprises a fourth switch transistor and a sixth switch transistor;
one end of the third switch transistor is connected to the first input and output terminal, the other end of the third switch transistor is connected to the drain of the first NMOS transistor; and wherein a first end of the fifth switch transistor is connected to the drain of the first NMOS transistor, and a second end of the fifth switch transistor is connected to a gate of the first NMOS transistor;
a first end of the fourth switch transistor is connected to the second input and output terminal, a second end of the fourth switch transistor is connected to the drain of the second NMOS transistor; and
a first end of the sixth switch transistor is connected to the drain of the second NMOS transistor, and a second end of the sixth switch transistor is connected to the gate of the second NMOS transistor.

8. The sensitivity amplifier of claim 7, wherein the third switch transistor, the fourth switch transistor, the fifth switch transistor, and the sixth switch transistor are either NMOS transistors or transmission gates composed of NMOS transistors and PMOS transistors.

9. A control method of the sensitivity amplifier as in claim 1, comprising a plurality of stages:
a pre-charging stage comprising:
pre-charging the first bit line and the second bit line to the preset voltage; and
an offset-voltage compensation stage comprising:
adjusting a connection mode of the first PMOS transistor, the second PMOS transistor, the second NMOS transistor, and the second NMOS transistor to compensate an offset voltage difference between the first input and output terminal and the second input and output terminal.

10. The control method of the sensitivity amplifier according to claim 9, wherein the offset-voltage compensation stage comprises the following steps:
placing at least the first switch unit, the second switch unit, the third switch unit, and the fourth switch unit in an off state, and placing the fifth switch unit and the sixth switch unit, the seventh switch unit and the eighth switch unit in a connected state, wherein the first input output terminal and the second input output terminal are charged to the power supply voltage;
placing the fifth switch unit and the sixth switch unit in the off state, short-circuiting a gate of the first NMOS transistor and the drain of the first NMOS transistor; and
connecting a gate the second NMOS transistor and a drain of the second NMOS transistor to discharge a voltage of the first input and output terminal to a threshold voltage of the second NMOS transistor, and discharging a voltage of the second input and output terminal to a threshold voltage of the first NMOS transistor.

11. The control method of the sensitivity amplifier according to claim 9, wherein after the offset-voltage compensation stage, the method further comprises:
a small signal amplification stage comprising:
connecting the first NMOS transistor and the second NMOS transistor into an amplification mode, and amplifying the offset voltage difference between the first input and output terminal and the second input and output terminal; and
connecting the first PMOS transistor and the second PMOS transistor in an amplification mode, and is pulling up a voltage of the first input and output terminal or a voltage of the second input and output terminal to the power supply voltage; and
a write back stage comprising writing back to the first bit line.

* * * * *